US006865132B2

(12) United States Patent
Schaefer et al.

(10) Patent No.: US 6,865,132 B2
(45) Date of Patent: *Mar. 8, 2005

(54) SYSTEM AND METHOD FOR QUICK SELF-REFRESH EXIT WITH TRANSITIONAL REFRESH

(75) Inventors: Scott Schaefer, Boise, ID (US); Todd D. Farrell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/781,149

(22) Filed: Feb. 17, 2004

(65) Prior Publication Data

US 2004/0165466 A1 Aug. 26, 2004

Related U.S. Application Data

(63) Continuation of application No. 10/128,936, filed on Apr. 23, 2002, now Pat. No. 6,693,837.

(51) Int. Cl.[7] ................................................. G11C 7/00
(52) U.S. Cl. ........................ 365/222; 365/233; 365/236
(58) Field of Search ................................. 365/222, 233, 365/236, 230.03, 233.5

(56) References Cited

U.S. PATENT DOCUMENTS

| 4,984,210 A | * | 1/1991 | Kumanoya et al. .......... 365/222 |
| 5,400,289 A | | 3/1995 | Blodgett ..................... 365/222 |
| 5,455,801 A | | 10/1995 | Blodgett et al. ............. 365/222 |
| 5,587,961 A | | 12/1996 | Wright et al. ............... 365/233 |
| 5,627,791 A | | 5/1997 | Wright et al. ............... 365/222 |
| 5,634,106 A | | 5/1997 | Yaezawa et al. ............ 395/433 |
| 5,673,233 A | | 9/1997 | Wright et al. ............... 365/233 |
| 5,793,776 A | | 8/1998 | Qureshi et al. ............. 371/22.1 |
| 5,796,669 A | | 8/1998 | Araki et al. ................ 365/222 |
| 5,818,777 A | | 10/1998 | Seyyedy .................... 365/222 |
| 5,905,690 A | | 5/1999 | Sakurai et al. ............. 365/233 |
| 5,912,852 A | | 6/1999 | Lawrence et al. .......... 365/201 |
| 5,995,424 A | | 11/1999 | Lawrence et al. .......... 365/201 |
| 5,995,434 A | | 11/1999 | Ryu .......................... 365/222 |
| 5,999,473 A | | 12/1999 | Harrington et al. ......... 365/222 |
| 6,118,719 A | | 9/2000 | Dell et al. .................. 365/222 |
| 6,134,168 A | | 10/2000 | Harrington et al. ......... 365/222 |
| 6,137,743 A | | 10/2000 | Kim .......................... 365/222 |
| 6,208,577 B1 | | 3/2001 | Mullarkey .................. 365/222 |
| 6,212,599 B1 | | 4/2001 | Baweja et al. ............. 711/106 |
| 6,226,724 B1 | | 5/2001 | Biggs ........................ 711/170 |

(List continued on next page.)

OTHER PUBLICATIONS

JEDEC Standard No. 21–C, "*SDRAM & SGRAM Architectural and Operational Features,*" pp. 3.11.5–1 to 3.11.5.4–5, no date given.

*Primary Examiner*—David Lam
(74) *Attorney, Agent, or Firm*—Dorsey & Whitney, LLP

(57) ABSTRACT

A system and method are disclosed to add logic to the self-refresh control logic presently employed in DRAM devices to ensure that, upon transitions between self-refresh mode and operational mode, at least one row of memory cells due to be refreshed is refreshed during the wait state following issuance of the transition command. Conducting this refresh during this existing wait state eliminates both the concern as to whether rows have been refreshed within the mandated refresh interval and the time required to execute an auto-refresh of at least one row upon completion of the transition.

73 Claims, 5 Drawing Sheets

U.S. PATENT DOCUMENTS

| | | | |
|---|---|---|---|
| 6,243,315 B1 * | 6/2001 | Goodman | 365/222 |
| 6,252,816 B1 | 6/2001 | Mullarkey | 365/222 |
| 6,317,852 B1 | 11/2001 | Lau et al. | 714/720 |
| 6,343,042 B1 | 1/2002 | Tsern et al. | 365/222 |
| 6,343,043 B2 | 1/2002 | Kai et al. | 365/222 |
| 6,359,823 B2 | 3/2002 | Mullarkey | 365/222 |
| 6,366,515 B2 | 4/2002 | Hidaka | 365/222 |
| 6,392,948 B1 | 5/2002 | Lee | 365/222 |
| 6,445,637 B2 | 9/2002 | Nanba | 365/222 |
| 6,452,859 B1 | 9/2002 | Shimano et al. | 365/230.06 |
| 6,545,925 B2 | 4/2003 | Lee | 365/222 |
| 6,549,479 B2 | 4/2003 | Blodgett | 365/222 |
| 6,556,497 B2 | 4/2003 | Cowles et al. | 365/222 |
| 6,567,332 B2 | 5/2003 | Sawhney | 365/222 |

* cited by examiner

SYSTEM AND METHOD FOR QUICK SELF-REFRESH EXIT WITH TRANSITIONAL REFRESH

This Application is a Continuation (Con.) of application Ser. No. 10/128,936 U.S. Pat. No. 6,693,837, filed Apr. 23, 2002.

TECHNICAL FIELD

The present invention is directed to dynamic random access memory ("DRAM") devices. More particularly, the present invention is directed to a system and method allowing DRAM devices to more efficiently exit from a self-refresh state so that the DRAM device can resume processing valid commands more quickly.

BACKGROUND OF THE INVENTION

Most computers and other digital systems have a system memory which often consists of dynamic random access memory ("DRAM") devices. DRAM devices are fairly inexpensive because a DRAM memory cell needs relatively few components to store a data bit as compared with other types of memory cells. Generally a DRAM memory cell consists of a transistor/capacitor pair whereas, in a static random access device (SRAM), each memory cell comprises four or more transistors. Thus, DRAM memory cells have fewer components than SRAM memory cells. As a result, DRAM arrays occupy far less area on a semiconductor substrate compared to SRAM arrays of the same size. Thus, DRAM devices are far less expensive to produce than SRAM devices. A large system memory can be implemented using DRAM devices for relatively low cost, making DRAM devices a very popular choice in many devices requiring a large memory capacity.

On the other hand, while DRAM devices are less expensive to produce than SRAM devices, DRAM devices suffer from the disadvantage that their memory cells must be continually refreshed because of the inherently transitory nature of their storage technology. Over time, the voltage stored across the capacitor dissipates as a result of current leakage. To offset this problem, each memory cell regularly must be refreshed within a maximum refresh interval by determining whether a high or low voltage was stored across that capacitor, and recharging the capacitor to that voltage. The refresh process, which basically involves reading a memory cell through a sense amplifier to recharge the memory cell's capacitor, is well known in the art, and it is reasonably simple and quick.

Notwithstanding how quick the refresh process might be, however, having to continually refresh all the memory cells in a DRAM memory array impedes the intended function of the memory: reading and writing data in response to processor directives. Even though memory cells are refreshed an entire row at a time, memory banks may be thousands of rows deep, and each row must be refreshed many times per second. Collectively, thousands upon thousands of refresh operations are required every second to preserve the contents of the memory cells in a DRAM device—thousands of operations during which the DRAM device is precluded from performing desired read and write functions. Moreover, unless the memory array is equipped with a dual accessing mechanism, a row cache device, or a functionally similar means, the array can be neither read from nor written to during a refresh cycle without interrupting or destroying the cycle. If the central processing unit or other controller initiates a memory read or write operation during a refresh cycle, the processor or controller needs to wait for completion of that refresh cycle along with any corresponding wait states or delay intervals. Clearly, waiting for refresh procedures slows the operational throughput of the computing system.

FIG. 1 depicts a conventional DRAM device 100. The DRAM device 100 is accessed through the address lines 110, the data lines 112, and a number of control lines 120–132. These control lines include CKE (clock enable) 120, CK* (clock signal—low) 122, CK (clock signal) 124, CS* (chip select—low enable) 126, WE* (write select—low enable) 128, CAS* (column address strobe—low enable) 130, and RAS* (row address strobe—low enable). The address lines 110, data lines 112, and control lines 120–132, enable the system to read and write data to the actual memory banks 150, as well as control the refreshing of the DRAM device 100.

The control logic 160 controls the read, write, and refresh operations of the DRAM device 100. The control logic 160 directs the operations of the DRAM device 100 as a function of the signals received at the control lines 120–132. Numerous other elements of the DRAM device 100 are depicted in FIG. 1, but the refresh counter 170 and the self-refresh control logic 180 are particularly relevant to this discussion.

The refresh counter 170 is an integral component in refreshing the DRAM device 100. The refresh counter 170 maintains a count corresponding to the row number in the memory banks 150 that was last refreshed or, if a row refresh is in progress, the number of the row currently being refreshed. Once a command is received to refresh a row, the refresh counter 170 is incremented by one, and the row of the memory banks 150 corresponding to the updated count stored in the refresh counter 170 is refreshed. The refresh counter 170 thereby tracks what row is next to be refreshed, controlling the sequencing of row refreshes.

Tracking the count maintained by the refresh counter 170, the rows of the memory banks 150 can be refreshed in either burst refresh or distributed refresh. Using burst refresh, all the rows of the memory banks 150 are refreshed in immediate succession, one after the other, for as long as it takes to refresh every row of the device. Operationally, the refresh counter 170 is incremented, the row indicated by the refresh counter 170 is refreshed, and this process repeats until each row of the memory banks 150 has been refreshed. Once all the rows have been successively refreshed, the DRAM device 100 once more is available for read and write operations until the memory banks 150 of the DRAM device 100 must again all be refreshed.

In a distributed refresh, one row of the memory banks 150 is refreshed at a time, then the DRAM device 100 is made available for useful operations until the next individual row of the memory banks 150 needs to be refreshed. As the designation "distributed" implies, this type of refresh distributes the time required to refresh every row in the memory banks 150 over the entire maximum refresh interval, instead of ceasing all read and write operations for the relatively long interval required to refresh every row in the memory banks 150 as in a burst refresh. Specifically, for each refresh command received, the refresh counter 170 is incremented, the row corresponding to the number indicated by the refresh counter 170 is refreshed, then the DRAM device 100 is made available for read and write operations until the next refresh command is received. This process repeats continuously. In a typical DRAM, having 4,096 rows and a maximum refresh interval of 64 milliseconds in its operational mode, a command to refresh one row would have to be issued approximately every 15 to 16 microseconds.

In addition, in a typical DRAM device, there are also two different types of refresh modes: auto-refresh and self-refresh. The first type, auto-refresh, is the command given to initiate a single refresh command. Whether the system employs burst refresh or distributed refresh to refresh its memory devices, issuance of an auto-refresh command initiates one refresh cycle for the entire memory bank or for a single row, respectively. Auto-refresh is, therefore, the "standard" refresh command used to refresh memory devices during normal operation. An auto-refresh command is issued to the DRAM device 100 by driving the CKE 120 and WE* 128 control lines high, and driving the CS* 126, RAS* 130 and CAS* 132 control lines low.

Auto-refresh operates synchronously with the system clock. With the CKE 120 and WE* 128 control lines driven high, and the CS* 126, RAS* 130 and CAS* 132 control lines driven low, the rising edge of the next clock signal initiates an auto-refresh of the next row of the memory banks 150. As is known in the art, the rising edge of the next clock signal is that point where the clock signals received at the CK* 122 and CK 124 control lines cross. As previously described, the refresh counter 170 is incremented to indicate the next row in the memory banks 150 that is being refreshed or is next to be refreshed. Between refreshes in a system employing a distributed refresh mode, or once all the rows have been refreshed in a system using a burst refresh mode, the signals applied to the control lines can be driven to the states signaling read, write, and other valid commands. An interval $t_{rfc}$, the time indicated by the device specification, should be permitted after the issuance of the auto-refresh command and the issuance of the next command.

By contrast, issuance of a self-refresh command places a DRAM device 100 in a continual, indefinite refresh cycle to preserve the data stored in the DRAM device 100. A self-refresh command typically is issued during a period when useful read and write requests will not be forthcoming, for example, when a user has placed the computing system into a sleep or standby mode. A self-refresh cycle typically employs a distributed refresh cycle internally.

During a self-refresh cycle, because the system will not be called upon to perform read or write commands, current and voltage switching in the DRAM device 100 is reduced. This relatively stable condition tends to ameliorate electrical and thermal effects which contribute to current leakage from the capacitors of the memory cells. As a result, while the memory cells still need to be refreshed to preserve the integrity of the data stored therein, the memory cells do not need to be refreshed as frequently as during an operational state. During self-refresh, the contents of the memory cells can be preserved by refreshing a row less frequently than every 15 milliseconds as required in this example DRAM device 100. In self-refresh state, the rows might not need to be refreshed for a period up to twice as long, or perhaps slightly longer, than is permitted during an operational state.

A self-refresh command is triggered by driving the CS*126, RAS* 130 and the CAS* 132 control lines low, driving the WE* 128 control line high, and, this time, driving the CKE 120 control line low. This command causes the self-refresh control logic 180 to periodically and repeatedly refresh every one of its rows, and also places all data, address, and control lines into a "don't care" state, with the exception of the CKE 120 control line. The CKE 120 control line being driven high takes the other control lines out of the "don't care" state, and signals the end of the self-refresh state. At that point, after a waiting interval described below, the system can then access the DRAM device 100 for read and write operations and/or to control the refreshing of the DRAM device through auto-refresh commands.

Although a self-refresh state is very similar to a repeating series of auto-refresh states, there is a critical difference: while a DRAM device 100 in an auto-refresh state is refreshed synchronously with the system clock, in a self-refresh state, the DRAM device is refreshed asynchronously and independently of the system clock. During a self-refresh state, the refreshing of the rows of the memory banks is controlled by the DRAM device's own, on-board self-refresh control logic 180. The on-board self-refresh control logic includes its own clocking system (not separately shown in FIG. 1) which pulses the self-refresh cycles, as described, at a less frequent rate than the system clock pulses operational commands.

During self-refresh, the memory banks 150 are refreshed according to the DRAM device's 100 own clock, asynchronously of the system clock during self-refresh. As a result, the system may issue a self-refresh exit command at any point during the self-refresh cycle of the DRAM device 100, either while a row is being refreshed or during a wait state between row refreshes. Accordingly, from the time the self-refresh exit command is issued until the DRAM device is available to process commands, the system must allow a waiting interval to pass. Waiting for this interval to pass will allow for the completion of the self-refresh of a row, if one was in progress as the time the self-refresh exit command was issued. If a self-refresh cycle was not in progress, the self-refresh control logic 180 will halt the self-refresh process and wait to make sure that no new refresh cycle begins once the self-refresh exit command has been received.

This waiting interval is denominated as $t_{xsr}$, to represent the time needed to "exit self-refresh." In either case, the system will not have any indication of whether a row refresh was in progress at the time the self-refresh exit command was issued, and the system must allow the interval $t_{xsr}$ to pass before issuing other commands. The passage of the interval $t_{xsr}$ is purely time wasted if a row refresh was not in progress when the exit self-refresh command was issued. Nonetheless, it is a necessary precaution because the self-refresh process operates asynchronously and independently of the system clock. The interval $t_{xsr}$ typically is equal to the time required to refresh one row, denominated as $t_{rfc}$, to represent the time to "refresh complete," plus one additional clock cycle to allow for the asynchonicity between the phase of the DRAM device 100 self-refresh clock and the system clock. Typically, this interval is on the order of 60 to 70 nanoseconds.

Certainly, potentially having to waste time just in case a row self-refresh was in progress is a concern for its own sake. However, a larger concern is the effect the asynchronicity between the self-refresh cycle and the system clock might have on the integrity of data stored in the DRAM device 100. There is a possibility that rows of memory cells in the DRAM device 100 may not be refreshed within the maximum refresh interval and the contents of the memory cells in these rows may become corrupted. As previously described, the relatively stable state of the DRAM device 100 in self-refresh mode reduces current leakage in the DRAM device 100 because no commands are being processed that might cause unpredictable voltage and current fluctuations. Consequently, the maximum refresh interval for a DRAM device 100 in self-refresh mode is longer than that for a DRAM device 100 in operational mode, and the interval between row refresh cycles is also longer. Potential problems arise upon the transition from the relatively stable, slower-refreshing self-refresh state to the more volatile operational state and from the cumulative effect of numerous transitions between self-refresh and operational states.

FIG. 2 illustrates these concerns. The chart 200 visually depicts the switching of a DRAM device over time in response to self-refresh exit commands. Specifically, the device state graph 210 shows how the DRAM device switches between the self-refresh mode 220 and the operational mode 230 in response to receipt of self-refresh and self-refresh exit commands as represented by the switching between low and high states of the CKE signal line as depicted by the CKE signal 240. As previously described, it is assumed that this DRAM device refreshes a row once every 40 microseconds while in self-refresh mode, and once every 15 microseconds while in operational mode. It is also assumed that, just at or prior to time t=0, a row was refreshed during the self-refresh state, incrementing the row counter to indicate the next row must be refreshed in 40 microseconds.

Before the next row is refreshed, however, at approximately time t=35 microseconds, the system issues a self-refresh exit command as represented by the CKE signal 240 driving high at 250. In response, the self-refresh mode 220 is exited as represented by the device state graph 210 exiting self-refresh and returning to operational status 230 at 260. Because the system clock and the DRAM device's on-board self-refresh clock operate asynchronously of each other, the system had no indication that the DRAM device was about to execute a row refresh operation at time t=40 microseconds. As a result, the row refresh operation was not executed, and as the DRAM device resumes the more volatile operational state, current leakage could affect the voltages stored in the memory cells and thereby undermine the integrity of the data stored. If the DRAM device has been in self-refresh mode for at least the time required to complete one complete self-refresh of each row in the DRAM device, assuming the device has 4,096 rows and self-refreshes one row every 40 microseconds, the next row to be refreshed has not been refreshed in nearly 164 milliseconds; this period is more than two and one-half times the maximum refresh interval of the DRAM device in its operational state.

To compound the problem, just before that row was to be auto-refreshed 15 microseconds after the DRAM device returned to its operational state 230, the CKE signal 240 transitions low at 270 to direct the DRAM device back into self-refresh mode 220 at 280. Upon returning to self-refresh mode 220, the self-refresh clock will become active to refresh the next row in 40 microseconds at approximately time t=90 microseconds. However, before that refresh occurs, once more the CKE signal 240 transition high at 290, directing the DRAM device to exit self-refresh mode 220 once again and resume operational status 230. Charge leakage continues, and the integrity of the data stored in the next row of the DRAM device to be refreshed—and the succeeding rows which also have not been refreshed for a growing interval of time—becomes even more questionable.

This example, wherein the self-refresh mode is exited, entered, and exited again so rapidly is a somewhat extreme illustration for the sake of highlighting the problem. Notwithstanding, in an era presently becoming increasingly dominated by gigahertz-clocking devices and increasingly larger DRAM devices with thousands upon thousands of rows of memory cells to be refreshed, actual loss of memory contents upon mode changes is a very real concern. This is particularly true if the DRAM devices are used in slower-clocking systems where auto-refresh commands may be issued even less frequently.

At present, there is one predominant solution to the problem of one or more rows not being refreshed in a timely fashion as a result of a DRAM device switching between self-refresh and operational modes. Specifically, this solution is the standard observed by the Joint Electron Device Engineering Council (JEDEC). The JEDEC standard suggests that, upon issuing the command to exit the self-refresh mode, and after the self-refresh mode has exited but before the system issues any other commands, the system should be programmed to first issue an auto-refresh command. This solution addresses the problems described previously in that the next row of memory is immediately refreshed upon exiting self-refresh, hopefully preserving the integrity of the data stored in that row. Similarly, even if the DRAM device repeatedly and frequently transitions between self-refresh mode and operational mode, as in the case depicted in FIG. 2, at least one row will be refreshed with each transition.

Unfortunately, the JEDEC suggestion has its shortcomings. First, because the JEDEC suggstion is a programming convention which depends on programmers actually and religiously including the mandated auto-refresh command in their programs. Accordingly, the JEDEC suggestion is often ignored by programmers, causing the problems previously described. Second, the JEDEC approach wastes time. Under the JEDEC approach, the system first must wait for the passage of the interval $t_{xsr}$ just in case a row was being self-refreshed at that moment the self-refresh exit command was issued; then, resumption of read and write operations is further delayed by the time it takes to complete an auto-refresh of the next row. At least one of those intervals represents a pure waste of time. If a row was being refreshed when the self-refresh command was issued, then auto-refresh of the next row—and the time required to complete it—was unnecessary. On the other hand, if a row was not being refreshed when the self-refresh command was issued, then waiting the interval $t_{xsr}$ for such a coincidental, hypothetical row refresh to complete was wasted.

FIG. 3A illustrates the time wasted using the JEDEC convention using a timing diagram of a system entering and exiting a self-refresh mode pursuant to this approach. Specifically, FIG. 3A shows the state of the CK 310, CK* 315, and CKE 320 signals, and the present command 325. Between times T0 330 and T1 340, the CKE signal 320 is driven low, directing the memory device into self-refresh mode which the memory device enters at T1 340. The self-refresh mode continues until between times Ta0 350 and Ta1 360, when the CKE signal 320 is driven high, directing the memory device to exit the self-refresh state. In the event that a row refresh was being executed at the time the device was directed to exit the self-refresh state, the device is permitted a wait state to allow that refresh to be completed. The system issues a null, NOP command at Ta1 360 allowing this interval to pass. After the conclusion of that transitional period $t_{xsr}$, the memory device is potentially available for read and write operations at Tb0 370. However, in accordance with the JEDEC approach, before useful read and write operations should be conducted, the system first issues an auto-refresh command at Tb0 370 to compensate for any refresh cycles that were lost while the memory device transitioned. In other words, after the self-refresh mode is terminated, the system must allow two intervals to pass upon exiting self-refresh: the waiting interval, $t_{xsr}$, and the time required to perform an auto-refresh operation, $t_{rfc}$.

In sum, devices currently used may not refresh rows of memory cells sufficiently rapidly upon switching between self-refresh and operational modes, and the contents of those memory cells could become corrupted. This problem currently is addressed by programming conventions. However, these programming conventions require that programmers actually implement the conventions, and they also waste time in mandating potentially unnecessary row refreshes at the conclusion of mandated transitional waiting intervals. It is to this concern that the present invention is directed.

SUMMARY OF THE INVENTION

Control logic is added to ensures refreshing of at least one row due to be refreshed while the self-refresh state exits and before the DRAM device resumes operational status. The added control logic avoids the possibility that rows will not be refreshed within the mandated refresh interval. Ensuring completion of the refresh of at least one row before exiting self-refresh eliminates a potentially wasted wait state followed by an interval being set aside for the system to the need for the system to manually direct an auto-refresh of at least one row. Alternatively, the added logic can be arrayed to refresh at least one row upon entering self-refresh, upon both entering and exiting self-refresh, or to perform a burst refresh of every row of the device before exiting self-refresh to ensure that no rows will go for too long a period without being refreshed as the self-refresh state is entered and exited.

DETAILED DESCRIPTION OF THE INVENTION

To avoid wasting so much time while still preserving memory integrity, a preferred embodiment of the present invention ensures that the next row of memory cells is refreshed during the interval $t_{xsr}$ after receipt of the self-refresh mode exit command, avoiding the time wasted on the auto-refresh cycle recommended by the JEDEC suggestion. In short, upon receipt of the self-refresh mode exit command, an embodiment of the present invention determines if a row is already being refreshed and, if not, the preferred embodiment disengages the memory device's on-board self-refresh clock and immediately initiates a refresh of the next row of memory cells. In other words, a preferred embodiment of the present invention has the advantage of the JEDEC suggestion in initiating a row refresh upon the transition between self-refresh and operational modes, but without wasting one of the time intervals required by the JEDEC suggestion. Furthermore, because under this preferred embodiment the DRAM device would include logic to execute this refresh upon self-refresh exit, this preferred embodiment of the present invention is not dependent upon programmers remembering to adhere to the JEDEC convention.

Figure 3A:
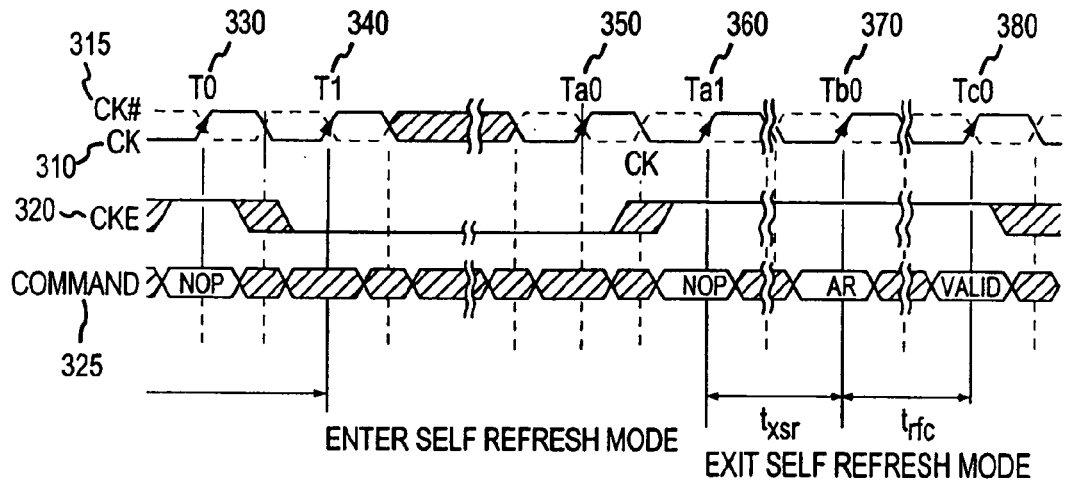
FIG. 3A is a timing diagram showing the operation of a conventional DRAM device observing conventional protocols upon exiting self-refresh.
Figure 3B:
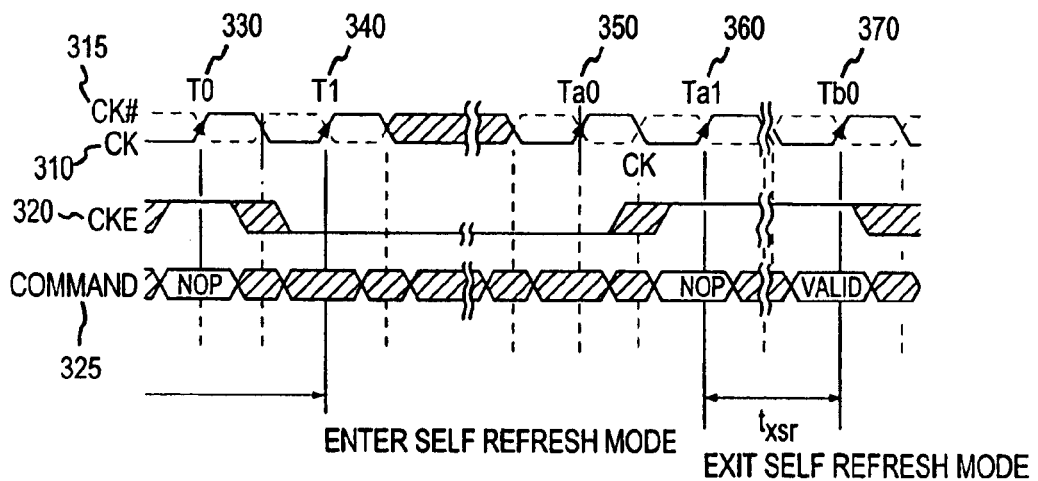
FIG. 3B is a timing diagram showing the operation of a DRAM device employing an embodiment of the present invention upon exiting self-refresh mode.

FIG. 3B shows how the preferred embodiment of the present invention eliminates the $t_{rfc}$ period, returning the memory device to operational status more quickly. The timing diagram of FIG. 3B depicts most of the same phases as FIG. 3A. In the interest of brevity, these aspects have been provided with the same reference numerals, and an explanation of the repetitive phases will not be repeated.

The main difference between the timing diagram depicted in FIG. 3B as opposed to the timing diagram depicting a conventional approach depicted in FIG. 3A is that the $t_{rfc}$ period has been eliminated as a result of the application of the preferred embodiment of the present invention. Specifically, at time Ta1 370 in FIG. 3B, the command being executed is not the autorefresh command executed during the corresponding interval in FIG. 3A, but instead is designated "VALID" to represent the preferred embodiment immediately refreshing the next row of memory cells. As a result, at time Tb0 370, instead of the system issuing an auto-refresh command to refresh the next row as shown in FIG. 3B, the preferred embodiment has already refreshed a row between times Ta1 and Tb0, and is ready for a valid operational command.

It should be emphasized that, under both the prior art JEDEC approach and the preferred embodiment of the present invention, once the system issues the self-refresh exit command, the system must allow passage of the interval $t_{xsr}$ to allow for the asynchronicity between the system clock and the self-refresh clock within the DRAM device. However, because the preferred embodiment ensures that, even if a row was not already being refreshed upon issuance of the self-refresh exit command, a row will be refreshed during passage of the interval $t_{xsr}$, there is no need for the system to perform an auto-refresh and wait the additional interval $t_{rfc}$ before resuming operations.

Figure 4:
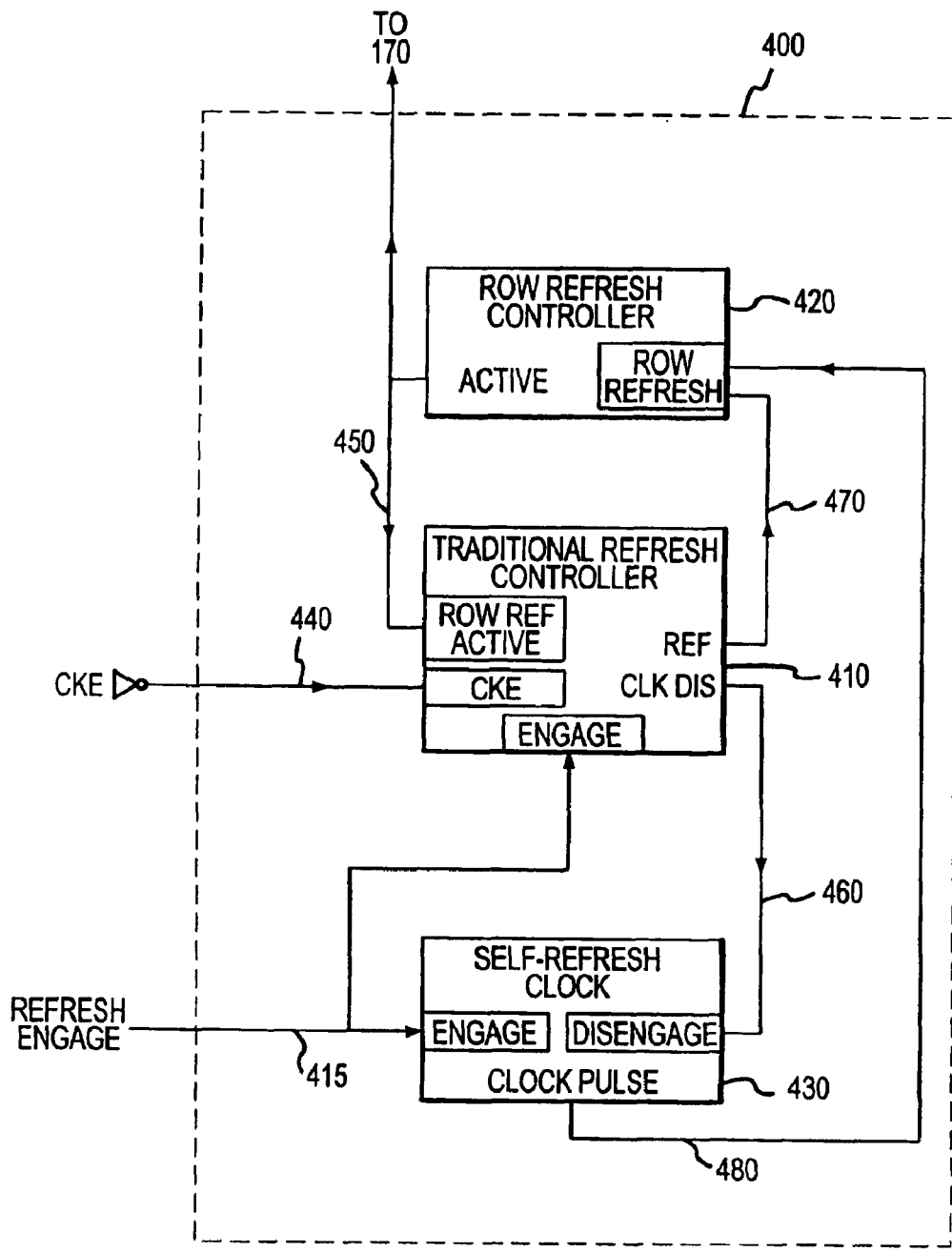
FIG. 4 is a block diagram of self-refresh control logic adapted to employ an embodiment of the present invention.

The preferred embodiment requires, as shown in functional block form in FIG. 4, some additional elements being applied to the self-refresh control logic 400. The transitional refresh controller 410 receives three signals and issues two signals. The row transitional refresh controller 410 receives a self-refresh engage signal 415 which indicates that the self-refresh command has been received, latched, and decoded. The refresh engage signal 415 also engages the self-refresh clock 430. The self-refresh clock 430, once engaged by the refresh engage signal 415, continues to pulse the row refresh controller 420 with its clock pulse signal 480 until the CKE signal 440 is driven high, signaling the end of the self-refresh mode. The transitional refresh controller 110 also receives the CKE signal 440, to monitor whether the system has issued a self-refresh mode exit command.

Figure 1:
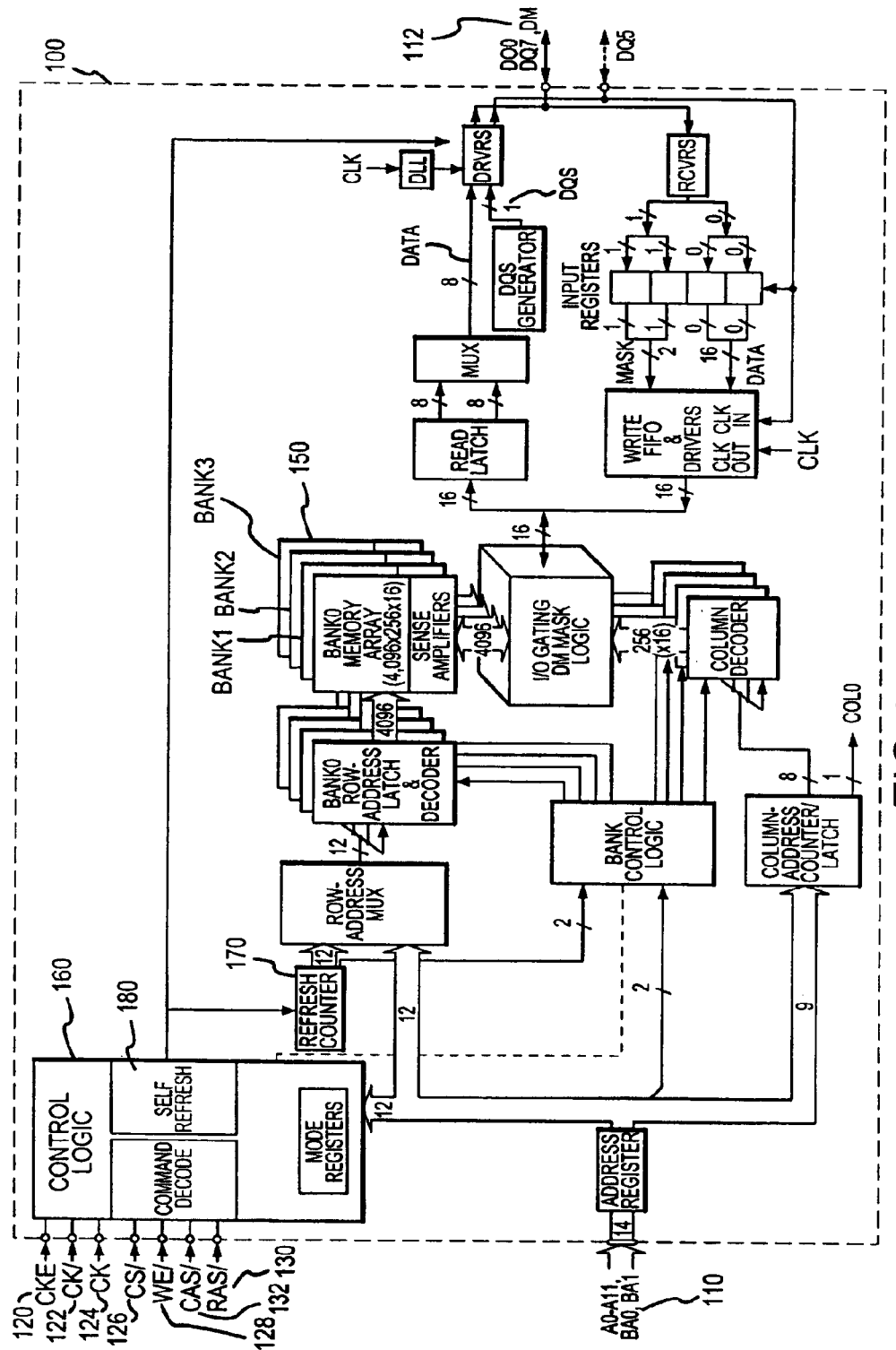
FIG. 1 is a block diagram of a conventional memory device equipped with self-refresh circuitry.
Figure 2:
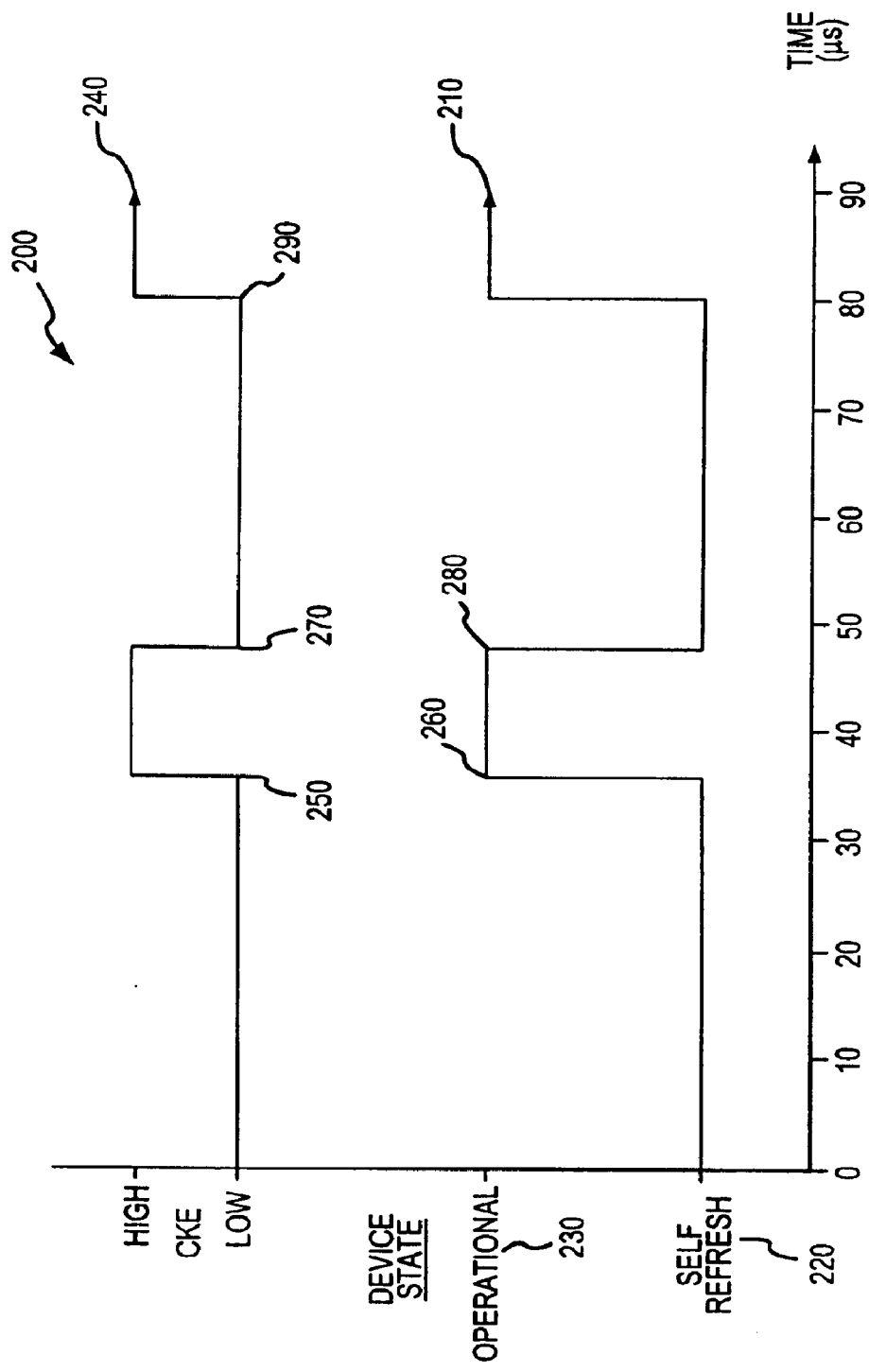
FIG. 2 is a timing diagram illustrating the possible refresh problems of a conventional DRAM device upon exiting self-refresh.

The transitional refresh controller 410 also monitors the row refresh active signal 450 generated by the row refresh circuitry 420 to determine whether a row already is being refreshed. If the row refresh active signal 450 indicates a row already is being refreshed when the CKE signal 420 is driven high, the transitional refresh controller 410 does nothing; the current row refresh is permitted to continue and conclude, then the self-refresh mode is exited. On the other hand, if the row refresh active signal 450 indicates a row is not being refreshed upon the CKE signal 440 being driven high, the transitional refresh controller 410 issues a self-refresh clock disengage signal 460, and immediately issues a row refresh signal 470 to cause the next row of memory cells to be refreshed. The row refresh controller 420 can be triggered to refresh a row either by the transitional refresh controller 410 or the clock pulse signal 480 generated by the self-refresh clock 430. The row refresh active signal 450 is also communicated to the refresh counter 170 (FIG. 1) to cause the refresh counter 170 to be incremented.

Upon completion of the row being refreshed, the memory device is returned to operational mode as already is known in the art. In either case, because a row already has immediately been refreshed, there is no longer any need for the system to be programmed to perform an auto-refresh on the next row upon the memory device resuming operational mode.

Figure 5:
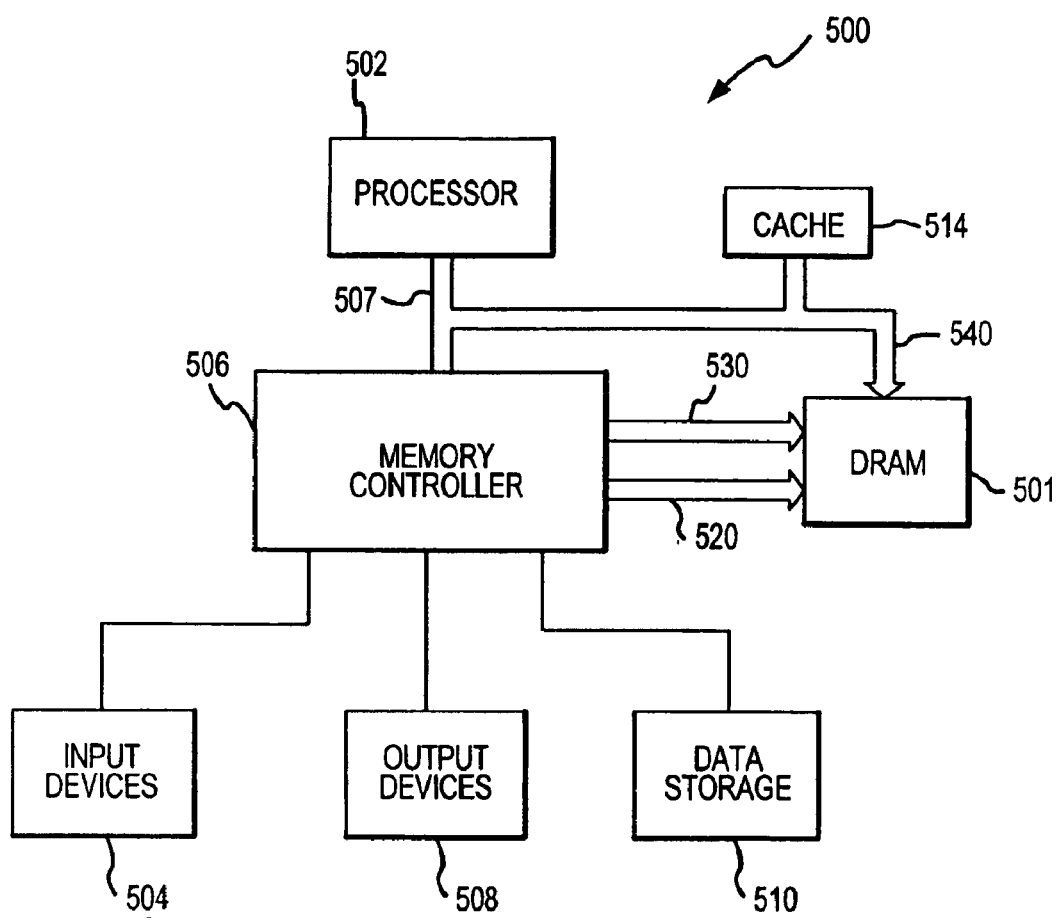
FIG. 5 is a block diagram of a computer system employing an embodiment of the present invention.

As shown in FIG. 5, a computer system 500 can take advantage of the present invention by incorporating DRAM devices 501 adapted with a preferred embodiment of the present invention as previously described. With reference to FIG. 5, a computer system 500 including the DRAM 501 includes a processor 502 for performing various functions, such as performing specific calculations or tasks. In addition, the computer system 500 includes one or more input devices 504, such as a keyboard or a mouse, coupled to the processor 502 through a memory controller 506 and a processor bus 507 to allow an operator to interface with the computer system 500. Typically, the computer system 500 also includes one or more output devices 508 coupled to the processor 502, such output devices typically being a printer or a video terminal. One or more data storage devices 510 are also typically coupled to the processor 502 through the memory controller 506 to store data or retrieve data from external storage media (not shown). Examples of typical data storage devices 510 include hard and floppy disks, tape cassettes, and compact disk read-only memories (CD-ROMs). The DRAM 501 is typically coupled to the memory controller 506 through the control bus 520 and the address bus 530. The data bus 540 of the DRAM 501 is coupled to the processor 502 either directly (as shown) or through the memory controller 506 to allow data to be written to and read from the DRAM 501. The computer system 500 may also include a cache memory 514 coupled to the processor 502 through the processor bus 507 to provide for the rapid storage and reading of data and/or instructions, as is well known in the art.

From the foregoing it will be appreciated that, although specific embodiments of the invention have been described herein for purposes of illustration, various modifications may be made without deviating from the spirit and scope of the invention. Just to name some examples, embodiments of the present invention also could preserve the integrity of data stored in memory by refreshing the next row upon entering self-refresh, upon entering and exiting self-refresh, or by refreshing all the rows in a burst refresh before transitioning between self-refresh and operational modes. Also, although this description of a preferred embodiment concerns a system in which the refresh counter is incremented and the next row in sequence is refreshed, the present invention could be used in a system where the row currently indicated by the refresh counter is refreshed before the refresh counter is updated. Similarly, the present invention could be used in a system where the refresh counter is decremented rather than incremented. In addition, the present invention could be used in a system where the refresh counter comprises a gray code counter, a conventional sequential counter, or any other type of counter. Accordingly, the invention is not limited except as by the appended claims.

What is claimed is:

1. A refresh transition system for a dynamic random access memory ("DRAM") device having a plurality of rows of memory cells, the refresh transition system comprising:
a transitional refresh controller receptive of a refresh signal and an exit refresh signal, the transitional refresh controller being operable to ensure a refresh of at least one of the rows of memory cells responsive to receipt of the refresh signal, the transitional refresh controller ensuring refresh of the at least one of the rows of memory cells regardless of whether or not the transitional refresh controller receives the exit refresh signal before the refresh of the at least one of the rows of memory cells has occurred when the exit refresh signal is received.

2. The refresh transition system of claim 1 wherein the refresh signal comprises a self-refresh signal, and wherein the exit refresh signal comprises an exit self-refresh signal.

3. The refresh transition system of claim 1 wherein the transitional refresh controller initiates a refresh of the at least one of the rows of memory cells responsive to receiving the refresh signal and responsive to receiving the exit refresh signal.

4. The refresh transition system of claim 1 wherein the transitional refresh controller initiates a refresh of only one of the rows of memory cells responsive receiving the refresh signal.

5. The refresh transition system of claim 1 wherein the transitional refresh controller initiates a refresh of a plurality of the rows of memory cells responsive to receiving the refresh signal.

6. The refresh transition system of claim 1 wherein the transitional refresh controller initiates a refresh of all of the rows of memory cells in the DRAM device responsive to receiving the refresh signal.

7. The refresh transition system of claim 1 wherein the transitional refresh controller causes the DRAM device to switch to an operational mode responsive to receiving the exit refresh signal upon completion of a refresh of one of the rows of memory cells.

8. A refresh transition system for a dynamic random access memory ("DRAM") device having a plurality of rows of memory cells, the refresh transition system comprising:
a control circuit switching between a refresh mode and an operation mode, the control circuit being operable to ensure a refresh of at least one of the rows of memory cells each time the control circuit switches to the refresh mode regardless of whether or not at least one of the rows of memory cells has been refreshed when the control circuit switches to the operation mode.

9. The refresh transition system of claim 8 wherein the control circuit initiates a refresh of the at least one of the rows of memory cells responsive to both the control circuit switching to the refresh mode and the control circuit switching to the operation mode.

10. The refresh transition system of claim 8 wherein the control circuit initiates a refresh of only one of the rows of memory cells responsive to the control circuit switching to the refresh mode.

11. The refresh transition system of claim 8 wherein the control circuit controller initiates a refresh of a plurality of the rows of memory cells responsive to the control circuit switching to the refresh mode.

12. The refresh transition system of claim 8 wherein the control circuit initiates a refresh of all of the rows of memory cells in the DRAM device responsive to the control circuit switching to the refresh mode.

13. The refresh transition system of claim 8 wherein the control circuit causes the DRAM device to switch to the operation mode upon completion of a refresh of one of the rows of memory cells.

14. A refresh transition system for a dynamic random access memory ("DRAM") device having a plurality of rows of memory cells, the refresh transition system comprising:
a transitional refresh controller receptive of a refresh signal and an exit refresh signal, the transitional refresh controller being operable to refresh at least one of the rows of memory cells responsive to receipt of the refresh signal, the transitional refresh controller further being operable to transition the DRAM device to an operating mode responsive to receipt of the exit refresh signal as soon as one of the rows of memory cells is not being refreshed.

15. The refresh transition system of claim 14 wherein the refresh signal comprises a self-refresh signal, and wherein the exit refresh signal comprises an exit self-refresh signal.

16. The refresh transition system of claim 14 wherein the transitional refresh controller initiates a refresh of the at least one of the rows of memory cells responsive to receiving the refresh signal and responsive to receiving the exit refresh signal.

17. The refresh transition system of claim 14 wherein the transitional refresh controller initiates a refresh of only one of the rows of memory cells responsive receiving the refresh signal.

18. The refresh transition system of claim 14 wherein the transitional refresh controller initiates a refresh of a plurality of the rows of memory cells responsive to receiving the refresh signal.

19. The refresh transition system of claim 14 wherein the transitional refresh controller initiates a refresh of all of the rows of memory cells in the DRAM device responsive to receiving the refresh signal.

20. A dynamic random access memory ("DRAM") device comprising:
   a plurality of rows of DRAM memory cells;
   a row addressing system operably connected to the DRAM array, the row addressing system responsive to a row address signal by accessing a row in the DRAM array corresponding to the row address signal;
   a column addressing system operably connected to the DRAM array, the column addressing system responsive to a column address signal by accessing a DRAM memory cell in a column of the DRAM array corresponding to the column address signal;
   a row refreshing circuit operably connected with the row addressing system, the row refreshing circuit directing a refresh of at least one of the rows of DRAM memory cells in response to a refresh initiation signal;
   a transitional refresh controller receptive of a refresh signal and an exit refresh signal, the transitional refresh controller being operable to generate the refresh initiation signal responsive to receipt of the refresh signal regardless of whether or not the transitional refresh controller has generated the refresh initiation signal when the transitional refresh controller receives the exit refresh signal; and
   a data path operably coupling the DRAM array to an external data terminal of the DRAM device.

21. The DRAM device of claim 20 wherein the refresh signal comprises a self-refresh signal, and wherein the exit refresh signal comprises an exit self-refresh signal.

22. The DRAM device of claim 20 wherein the transitional refresh controller initiates a refresh of the at least one of the rows of DRAM memory cells responsive to receiving the refresh signal and responsive to receiving the exit refresh signal.

23. The DRAM device of claim 20 wherein the transitional refresh controller initiates a refresh of only one of the rows of DRAM memory cells responsive receiving the refresh signal.

24. The DRAM device of claim 20 wherein the transitional refresh controller initiates a refresh of a plurality of the rows of DRAM memory cells responsive to receiving the refresh signal.

25. The DRAM device of claim 20 wherein the transitional refresh controller initiates a refresh of all of the rows of DRAM memory cells in the DRAM device responsive to receiving the refresh signal.

26. The DRAM device of claim 20 wherein the transitional refresh controller causes the DRAM device to switch to an operational mode responsive to receiving the exit refresh signal upon completion of a refresh of one of the rows of DRAM memory cells.

27. A dynamic random access memory ("DRAM") device comprising:
   a plurality of rows of DRAM memory cells;
   a row addressing system operably connected to the DRAM array, the row addressing system responsive to a row address signal by accessing a row in the DRAM array corresponding to the row address signal;
   a column addressing system operably connected to the DRAM array, the column addressing system responsive to a column address signal by accessing a DRAM memory cell in a column of the DRAM array corresponding to the column address signal;
   a row refreshing circuit operably connected with the row addressing system, the row refreshing circuit directing a refresh of at least one of the rows of DRAM memory cells in response to a refresh initiation signal;
   a control circuit switching between a refresh mode and an operation mode, the control circuit being operable to ensure a refresh of at least one of the rows of DRAM memory cells each time the control circuit switches to the refresh mode regardless of whether or not at least one of the rows of DRAM memory cells has been refreshed when the control circuit switches to the operation mode; and
   a data path operably coupling the DRAM array to an external data terminal of the DRAM device.

28. The DRAM device of claim 27 wherein the control circuit initiates a refresh of the at least one of the rows of DRAM memory cells responsive to both the control circuit switching to the refresh mode and the control circuit switching to the operation mode.

29. The DRAM device of claim 27 wherein the control circuit initiates a refresh of only one of the rows of DRAM memory cells responsive to the control circuit switching to the refresh mode.

30. The DRAM device of claim 27 wherein the control circuit controller initiates a refresh of a plurality of the rows of DRAM memory cells responsive to the control circuit switching to the refresh mode.

31. The DRAM device of claim 27 wherein the control circuit initiates a refresh of all of the rows of DRAM memory cells in the DRAM device responsive to the control circuit switching to the refresh mode.

32. The DRAM device of claim 27 wherein the control circuit causes the DRAM device to switch to the operation mode upon completion of a refresh of one of the rows of memory cells.

33. A dynamic random access memory ("DRAM") device comprising:
   a plurality of rows of DRAM memory cells;
   a row addressing system operably connected to the DRAM array, the row addressing system responsive to a row address signal by accessing a row in the DRAM array corresponding to the row address signal;
   a column addressing system operably connected to the DRAM array, the column addressing system responsive to a column address signal by accessing a DRAM memory cell in a column of the DRAM array corresponding to the column address signal;

a row refreshing circuit operably connected with the row addressing system, the row refreshing circuit directing a refresh of at least one of the rows of DRAM memory cells in response to a refresh initiation signal;

a transitional refresh controller receptive of a refresh signal and an exit refresh signal, the transitional refresh controller being operable to refresh at least one of the rows of DRAM memory cells responsive to receipt of the refresh signal, the transitional refresh controller further being operable to transition the DRAM device to an operating mode responsive to receipt of the exit refresh signal as soon as one of the rows of DRAM memory cells is not being refreshed; and a data path operably coupling the DRAM array to an external data terminal of the DRAM device.

34. The DRAM device of claim 33 wherein the refresh signal comprises a self-refresh signal, and wherein the exit refresh signal comprises an exit self-refresh signal.

35. The DRAM device of claim 33 wherein the transitional refresh controller initiates a refresh of the at least one of the rows of memory cells responsive to receiving the refresh signal and responsive to receiving the exit refresh signal.

36. The DRAM device of claim 33 wherein the transitional refresh controller initiates a refresh of only one of the rows of memory cells responsive receiving the refresh signal.

37. The DRAM device of claim 33 wherein the transitional refresh controller initiates a refresh of a plurality of the rows of memory cells responsive to receiving the refresh signal.

38. The DRAM device of claim 33 wherein the transitional refresh controller initiates a refresh of all of the rows of memory cells in the DRAM device responsive to receiving the refresh signal.

39. A computer system, comprising:

a processor;

an input device operably connected to the processor allowing data to be entered into the computer system;

an output device operably connected to the processor allowing data to be output from the computer system; and a system memory operably connected to the processor, the system memory comprising a plurality of dynamic random access memory ("DRAM") devices, each of the DRAM devices comprising:

a plurality of rows of DRAM memory cells;

a row addressing system operably connected to the DRAM array, the row addressing system responsive to a row address signal by accessing a row in the DRAM array corresponding to the row address signal;

a column addressing system operably connected to the DRAM array, the column addressing system responsive to a column address signal by accessing a DRAM memory cell in a column of the DRAM array corresponding to the column address signal;

a row refreshing circuit operably connected with the row addressing system, the row refreshing circuit directing a refresh of at least one of the rows of DRAM memory cells in response to a refresh initiation signal;

a control circuit switching between a refresh mode and an operation mode, the control circuit being operable to ensure a refresh of at least one of the rows of DRAM memory cells each time the control circuit switches to the refresh mode regardless of whether or not at least one of the rows of DRAM memory cells has been refreshed when the control circuit switches to the operation mode; and a data path operably coupling the DRAM array to an external data terminal of the DRAM device.

40. The computer system of claim 39 wherein the refresh signal comprises a self-refresh signal, and wherein the exit refresh signal comprises an exit self-refresh signal.

41. The computer system of claim 39 wherein the transitional refresh controller initiates a refresh of the at least one of the rows of DRAM memory cells responsive to receiving the refresh signal and responsive to receiving the exit refresh signal.

42. The computer system of claim 39 wherein the transitional refresh controller initiates a refresh of only one of the rows of DRAM memory cells responsive receiving the refresh signal.

43. The computer system of claim 39 wherein the transitional refresh controller initiates a refresh of a plurality of the rows of DRAM memory cells responsive to receiving the refresh signal.

44. The computer system of claim 39 wherein the transitional refresh controller initiates a refresh of all of the rows of DRAM memory cells in the DRAM device responsive to receiving the refresh signal.

45. The computer system of claim 39 wherein the transitional refresh controller causes the DRAM device to switch to an operational mode responsive to receiving the exit refresh signal upon completion of a refresh of one of the rows of DRAM memory cells.

46. A computer system, comprising:

a processor;

an input device operably connected to the processor allowing data to be entered into the computer system;

an output device operably connected to the processor allowing data to be output from the computer system; and a system memory operably connected to the processor, the system memory comprising a plurality of dynamic random access memory ("DRAM") devices, each of the DRAM devices comprising:

a plurality of rows of DRAM memory cells;

a row addressing system operably connected to the DRAM array, the row addressing system responsive to a row address signal by accessing a row in the DRAM array corresponding to the row address signal;

a column addressing system operably connected to the DRAM array, the column addressing system responsive to a column address signal by accessing a DRAM memory cell in a column of the DRAM array corresponding to the column address signal;

a row refreshing circuit operably connected with the row addressing system, the row refreshing circuit directing a refresh of at least one of the rows of DRAM memory cells in response to a refresh initiation signal;

a control circuit switching between a refresh mode and an operation mode, the control circuit being operable to ensure a refresh of at least one of the rows of DRAM memory cells each time the control circuit switches to the refresh mode regardless of whether or not at least one of the rows of DRAM memory cells has been refreshed when the control circuit switches to the operation mode; and a data path operably coupling the DRAM array to an external data terminal of the DRAM device.

47. The computer system of claim 46 wherein the control circuit initiates a refresh of the at least one of the rows of DRAM memory cells responsive to both the control circuit switching to the refresh mode and the control circuit switching to the operation mode.

48. The computer system of claim 46 wherein the control circuit initiates a refresh of only one of the rows of DRAM memory cells responsive to the control circuit switching to the refresh mode.

49. The computer system of claim 46 wherein the control circuit controller initiates a refresh of a plurality of the rows of DRAM memory cells responsive to the control circuit switching to the refresh mode.

50. The computer system of claim 46 wherein the control circuit initiates a refresh of all of the rows of DRAM memory cells in the DRAM device responsive to the control circuit switching to the refresh mode.

51. The computer system of claim 46 wherein the control circuit causes the DRAM device to switch to the operation mode upon completion of a refresh of one of the rows of memory cells.

52. A computer system, comprising:
a processor;
an input device operably connected to the processor allowing data to be entered into the computer system;
an output device operably connected to the processor allowing data to be output from the computer system; and
a system memory operably connected to the processor, the system memory comprising a plurality of dynamic random access memory ("DRAM") devices, each of the DRAM devices comprising:
a plurality of rows of DRAM memory cells;
a row addressing system operably connected to the DRAM array, the row addressing system responsive to a row address signal by accessing a row in the DRAM array corresponding to the row address signal;
a column addressing system operably connected to the DRAM array, the column addressing system responsive to a column address signal by accessing a DRAM memory cell in a column of the DRAM array corresponding to the column address signal;
a row refreshing circuit operably connected with the row addressing system, the row refreshing circuit directing a refresh of at least one of the rows of DRAM memory cells in response to a refresh initiation signal;
a transitional refresh controller receptive of a refresh signal and an exit refresh signal, the transitional refresh controller being operable to refresh at least one of the rows of DRAM memory cells responsive to receipt of the refresh signal, the transitional refresh controller further being operable to transition the DRAM device to an operating mode responsive to receipt of the exit refresh signal as soon as one of the rows of DRAM memory cells is not being refreshed; and
a data path operably coupling the DRAM array to an external data terminal of the DRAM device.

53. The computer system of claim 52 wherein the refresh signal comprises a self-refresh signal, and wherein the exit refresh signal comprises an exit self-refresh signal.

54. The computer system of claim 52 wherein the transitional refresh controller initiates a refresh of the at least one of the rows of memory cells responsive to receiving the refresh signal and responsive to receiving the exit refresh signal.

55. The computer system of claim 52 wherein the transitional refresh controller initiates a refresh of only one of the rows of memory cells responsive receiving the refresh signal.

56. The computer system of claim 52 wherein the transitional refresh controller initiates a refresh of a plurality of the rows of memory cells responsive to receiving the refresh signal.

57. The computer system of claim 52 wherein the transitional refresh controller initiates a refresh of all of the rows of memory cells in the DRAM device responsive to receiving the refresh signal.

58. A method for transitioning a dynamic random access memory ("DRAM") device having a plurality of rows of memory cells between a refresh mode and an operating mode, comprising:
detecting when a processor-based system directs the DRAM device to transition to the refresh mode;
detecting when the processor-based system directs the DRAM device to transition to the operating mode; and
initiating a refresh of at least one of the rows of memory cells responsive to detecting that the computing system is directing the DRAM device to transition to the refresh mode regardless of whether or not at least one of the rows of memory cells has been refreshed when the processor-based system is directing the DRAM device to transition to the operating mode.

59. The method of claim 58 wherein the act of initiating a refresh of at least one of the rows of memory cells comprises initiating a refresh of at least one of the rows of memory cells responsive to both detecting that the processor-based system is directing the DRAM device to transition to the refresh mode and detecting that the processor-based system is directing the DRAM device to transition to the operating mode.

60. The method of claim 58 wherein the act of initiating a refresh of at least one of the rows of memory cells comprises initiating a refresh of only one of the rows of memory cells.

61. The method of claim 58 wherein the act of initiating a refresh of at least one of the rows of memory cells comprises initiating a refresh of a plurality of the rows of memory cells.

62. The method of claim 58 wherein the act of initiating a refresh of at least one of the rows of memory cells comprises initiating a refresh of all of the rows of memory cells in the DRAM device.

63. A method for transitioning a dynamic random access memory ("DRAM") device having a plurality of rows of memory cells between a refresh mode and an operating mode, comprising:
detecting when a processor-based system couples a refresh signal to the DRAM device;
detecting when the processor-based system couples an exit refresh signal to the DRAM device; and
ensuring a refresh of at least one of the rows of memory cells responsive to detecting the refresh signal regardless of whether or not the exit refresh signal is detected before the refresh of the at least one of the rows of memory cells has occurred when the exit refresh signal is detected.

64. The method of claim 63 wherein the refresh signal comprises a self-refresh signal, and wherein the exit refresh signal comprises an exit self-refresh signal.

65. The method of claim 63 wherein the act of ensuring a refresh of at least one of the rows of memory cells comprises ensuring a refresh of only one of the rows of memory cells.

66. The method of claim 63 wherein the act of ensuring a refresh of at least one of the rows of memory cells comprises ensuring a refresh of a plurality of the rows of memory cells.

67. The method of claim 63 wherein the act of ensuring a refresh of at least one of the rows of memory cells comprises ensuring a refresh of all of the rows of memory cells in the DRAM device.

68. The method of claim 63, further comprising transitioning the DRAM device to an operational mode responsive to detecting that the processor-based system has coupled the exit refresh signal to the DRAM device.

69. A method for transitioning a dynamic random access memory ("DRAM") device having a plurality of rows of memory cells between a refresh mode and an operating mode, comprising:

detecting when a processor-based system couples a refresh signal to the DRAM device;

detecting when the processor-based system couples an exit refresh signal to the DRAM device;

detecting when none of the rows of memory cells in the DRAM device is being refreshed;

refreshing at least one of the rows of memory cells responsive to detecting the refresh signal; and transitioning the DRAM device to an operating mode responsive to detecting the exit refresh signal and detecting that none of the rows of memory cells is being refreshed.

70. The method of claim 69 wherein the refresh signal comprises a self-refresh signal, and wherein the exit refresh signal comprises an exit self-refresh signal.

71. The method of claim 69 wherein the act of refreshing at least one of the rows of memory cells responsive to detecting the refresh signal comprises refreshing only one of the rows of memory cells responsive to detecting the refresh signal.

72. The method of claim 69 wherein the act of refreshing at least one of the rows of memory cells responsive to detecting the refresh signal comprises refreshing a plurality of the rows of memory cells responsive to detecting the refresh signal.

73. The method of claim 69 wherein the act of refreshing at least one of the rows of memory cells responsive to detecting the refresh signal comprises refreshing all of the rows of memory cells in the DRAM device responsive to detecting the refresh signal.

* * * * *